US008686691B2

(12) United States Patent
Mano et al.

(10) Patent No.: US 8,686,691 B2
(45) Date of Patent: Apr. 1, 2014

(54) DETERMINATION SYSTEM AND DETERMINATION METHOD FOR DETERMINING WHETHER METAL LITHIUM IS PRECIPITATED IN A LITHIUM ION SECONDARY BATTERY, AND VEHICLE EQUIPPED WITH THE DETERMINATION SYSTEM

(75) Inventors: Ryo Mano, Toyota (JP); Yusuke Ito, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 289 days.

(21) Appl. No.: 13/024,380

(22) Filed: Feb. 10, 2011

(65) Prior Publication Data

US 2011/0206952 A1  Aug. 25, 2011

(30) Foreign Application Priority Data

Feb. 22, 2010 (JP) ................. 2010-035727

(51) Int. Cl.
*H02J 7/00* (2006.01)
(52) U.S. Cl.
USPC ........................ 320/134; 320/127; 324/427
(58) Field of Classification Search
USPC .......................................................... 320/134
See application file for complete search history.

(56) References Cited

U.S. PATENT DOCUMENTS

| | | | | |
|---|---|---|---|---|
| 5,602,481 | A * | 2/1997 | Fukuyama | 324/434 |
| 5,729,116 | A | 3/1998 | Tsenter | |
| 7,560,901 | B2 * | 7/2009 | Fujikawa et al. | 320/134 |
| 2005/0001591 | A1 * | 1/2005 | Nagamine et al. | 320/132 |
| 2010/0085015 | A1 * | 4/2010 | Hamaguchi et al. | 320/134 |
| 2012/0179398 | A1 | 7/2012 | Ueki et al. | |

FOREIGN PATENT DOCUMENTS

| | | |
|---|---|---|
| JP | 8-190934 | 7/1996 |
| JP | 2003-59544 | 2/2003 |
| JP | 2003-68368 | 3/2003 |
| JP | 2003-308885 | 10/2003 |
| JP | 2006-252849 | 9/2006 |
| JP | 2008-192607 | 8/2008 |
| JP | 2009-199936 | 9/2009 |
| JP | 2009-244088 | 10/2009 |

OTHER PUBLICATIONS

Extended European Search Report for EP Appl. No. 11153826.0 dated May 26, 2011.

(Continued)

*Primary Examiner* — Arun Williams
(74) *Attorney, Agent, or Firm* — Finnegan, Henderson, Farabow, Garrett & Dunner, LLP

(57) ABSTRACT

A determination system for determining whether metal lithium is precipitated in a lithium ion secondary battery includes: a discharging unit that causes the lithium ion secondary battery to perform constant current discharge until a voltage of the lithium ion secondary battery becomes a voltage corresponding to a predetermined low state of charge; a natural increase acquisition unit that acquires a natural increase in voltage of the lithium ion secondary battery after the constant current discharge is terminated; and a precipitation determining unit the compares the acquired natural increase with a predetermined threshold, that determines that the metal lithium is not precipitated when the natural increase is larger than or equal to the threshold, and that determines that the metal lithium is precipitated when the natural increase is smaller than the threshold.

13 Claims, 5 Drawing Sheets

(56) References Cited

OTHER PUBLICATIONS

U.S. Appl. No. 14/068,472 by Ryo Mano et al. filed on Oct. 31, 2013 entitled "Determination System And Determination Method For Determining Whether Metal Lithium is Precipitated In A Lithium Ion Secondary Battery, And Vehicle Equipped With The Determination System,".

* cited by examiner ts entirety.

DETERMINATION SYSTEM AND DETERMINATION METHOD FOR DETERMINING WHETHER METAL LITHIUM IS PRECIPITATED IN A LITHIUM ION SECONDARY BATTERY, AND VEHICLE EQUIPPED WITH THE DETERMINATION SYSTEM

INCORPORATION BY REFERENCE

The disclosure of Japanese Patent Application No. 2010-035727 filed on Feb. 22, 2010 including the specification, drawings and abstract is incorporated herein by reference in its entirety.

BACKGROUND OF THE INVENTION

1. Field of the Invention

The invention relates to a determination system and determination method for determining whether metal lithium is precipitated in a lithium ion secondary battery, and a vehicle equipped with the determination system.

2. Description of the Related Art

Generally, the internal state of a lithium ion secondary battery is inspected. As one internal state of the lithium ion secondary battery, it is intended to recognize through inspection whether metal lithium is precipitated. For example, a phenomenon called "dendrite precipitation" in Japanese Patent Application Publication No. 8-190934 (JP-A-8-190934) is also the precipitation of metal lithium. A lithium ion secondary battery originally does not contain metal lithium; however, depending on usage, metal lithium may precipitate on a surface of a negative electrode. A lithium ion secondary battery that has reached such a state needs to be replaced because deterioration in performance is remarkable. Therefore, it is necessary to recognize whether metal lithium is precipitated in a lithium ion secondary battery.

A method of detecting the internal state of a lithium ion secondary battery is, for example, described in Japanese Patent Application Publication No. 2003-59544 (JP-A-2003-59544). In the method described in JP-A-2003-59544, the lithium ion secondary battery first undergoes constant current charge and subsequently undergoes constant voltage charge. Then, a difference in index, such as charged capacity and internal resistance, between the charged battery and a standard battery is obtained. The internal state of the inspected battery is intended to be recognized on the basis of the above difference.

However, in order to apply the above related art, a power supply for charging an inspected battery needs to be compatible with both constant current charge and constant voltage charge. For this reason, a complex power supply system is required. Particularly, for example, in the case of in-car application, it is difficult to perform required charge by an electrical system of a vehicle itself. Generally, the electrical system of a vehicle is not designed for constant voltage control.

In addition, information about a decrease in capacity or an increase in internal resistance may be acquired as a result of inspection; however, it is impossible to determine what factor gives the acquired information. That is, not only in the case of precipitation of metal lithium but also in the case of normal usage degradation (hereinafter, referred to as "cycle degradation") that is not attended with precipitation of metal lithium, the tendency of a decrease in capacity or an increase in internal resistance is observed. Therefore, it has been difficult to determine whether metal lithium is precipitated.

SUMMARY OF INVENTION

The invention provides a determination system and determination method for determining whether metal lithium is precipitated in a lithium ion secondary battery without using constant voltage control, and a vehicle equipped with the determination system.

A first aspect of the invention provides a determination system for determining whether metal lithium is precipitated in a lithium ion secondary battery. The determination system includes: a discharging unit that causes the lithium ion secondary battery to perform constant current discharge until a voltage of the lithium ion secondary battery becomes a voltage corresponding to a predetermined low state of charge; a natural increase acquisition unit that acquires a natural increase in voltage of the lithium ion secondary battery after the constant current discharge is terminated; and a precipitation determining unit the compares the acquired natural increase with a predetermined threshold, that determines that the metal lithium is not precipitated when the natural increase is larger than or equal to the threshold, and that determines that the metal lithium is precipitated when the natural increase is smaller than the threshold.

A second aspect of the invention provides a vehicle that includes: a lithium ion secondary battery; and the determination system according to the first aspect.

A third aspect of the invention provides a determination method for determining whether metal lithium is precipitated in a lithium ion secondary battery. The determination method includes: causing the lithium ion secondary battery to perform constant current discharge; terminating the constant current discharge when the lithium ion secondary battery has a predetermined low state of charge through the constant current discharge; acquiring a natural increase in voltage of the lithium ion secondary battery after the constant current discharge is terminated; comparing the acquired natural increase with a predetermined threshold; and determining that the metal lithium is not precipitated when the natural increase is larger than or equal to the threshold, and determining that the metal lithium is precipitated when the natural increase is smaller than the threshold.

In a battery in which metal lithium is precipitated, polarization of a negative electrode is remarkable when the SOC is low, so polarization of the negative electrode becomes large while polarization of a positive electrode is not so large. Therefore, only the polarization of the negative electrode contributes to an increase in internal resistance when the SOC is low. Therefore, in comparison with a battery in which metal lithium is not precipitated, the internal resistance is small when the SOC is low. In the aspects of the invention, this situation is determined on the basis of a natural increase in battery voltage after the battery is subjected to constant current discharge.

According to the aspects of the invention, it is possible to provide a determination system and determination method for determining whether metal lithium is precipitated in a lithium ion secondary battery without using constant voltage control, and a vehicle equipped with the determination system.

BRIEF DESCRIPTION OF DRAWINGS

The features, advantages, and technical and industrial significance of this invention will be described below with reference to the accompanying drawings, in which like numerals denote like elements, and wherein.

DETAILED DESCRIPTION OF EMBODIMENTS

Figure 1:
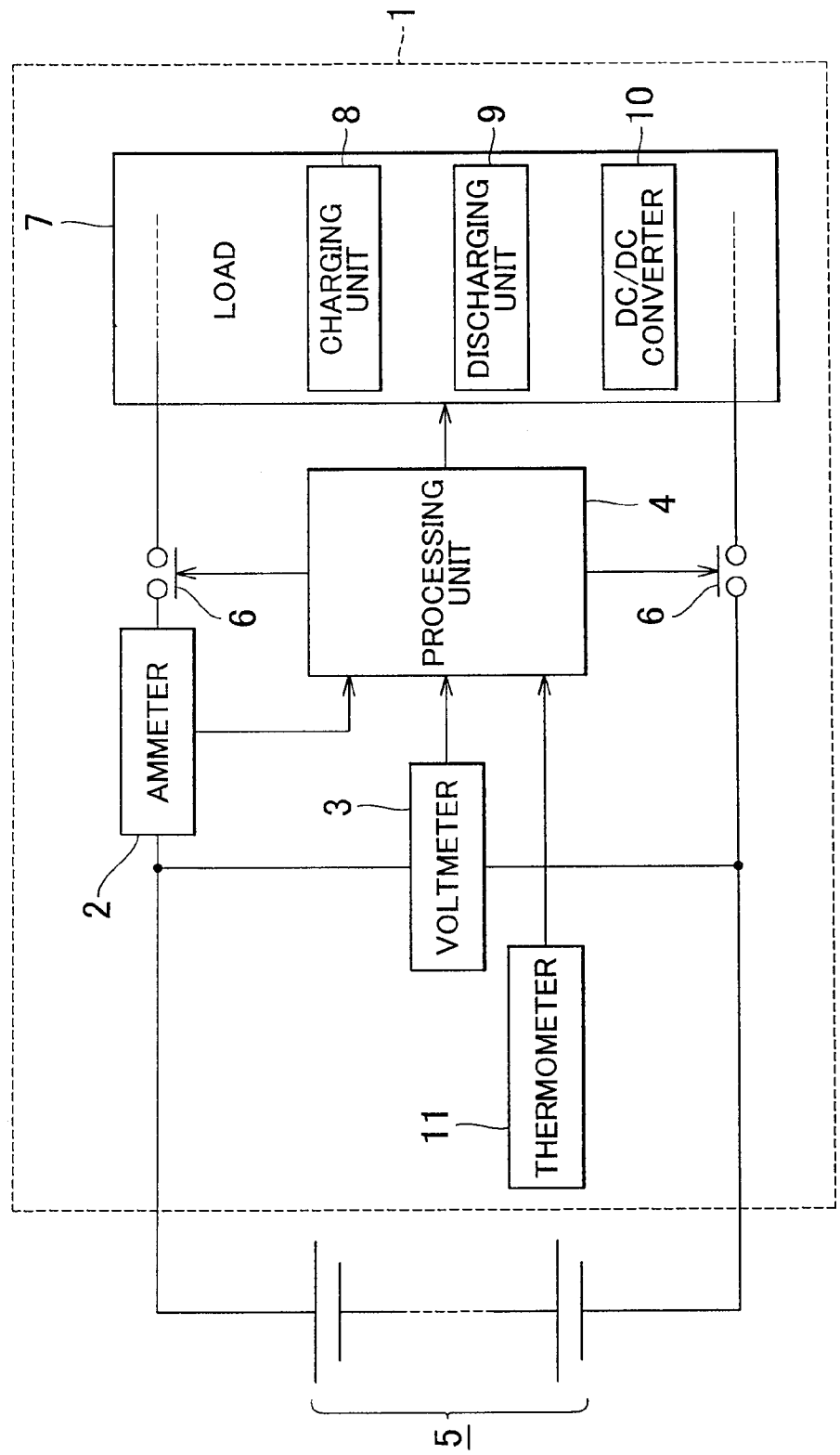
FIG. 1 is a block diagram of a lithium precipitation determination system according to an embodiment of the invention.

Hereinafter, an embodiment of the invention will be described in detail with reference to the accompanying drawings. A lithium precipitation determination system 1 for a lithium ion secondary battery according to the present embodiment is configured as shown in FIG. 1. The lithium precipitation determination system 1 for a lithium ion secondary battery shown in FIG. 1 determines whether metal lithium is precipitated in a battery group 5. The battery group 5 is a battery pack in which a plurality of lithium ion secondary batteries are serially connected.

The lithium precipitation determination system 1 includes an ammeter 2, a voltmeter 3, a processing unit 4, a load 7 and a thermometer 11. The ammeter 2 measures the magnitude of current that flows through the battery group 5. The voltmeter 3 measures the voltage between both ends of the battery group 5. The processing unit 4 acquires the results measured by the voltmeter 3, and the like, and then makes the above described determination or performs processing necessary for the determination on the basis of the measured results. The processing unit 4 also controls the load 7. The thermometer 11 acquires the temperature of the battery group 5.

The load 7 includes a charging unit 8, a discharging unit 9 and a DC/DC converter 10. The charging unit 8 functions to supply charging current to the battery group 5. The charging unit 8 is, for example, a generator. The discharging unit 9 receives discharging current from the battery group 5 to operate in some way. The discharging unit 9 is, for example, a motor. One device may serve as both the charging unit 8 and the discharging unit 9. The DC/DC converter 10 uses the discharging unit 9 to discharge current as constant current discharge, which will be described later. In addition, a relay 6 is arranged between the load 7 and the battery group 5. The relay 6 is also operated by the processing unit 4.

Figure 2:
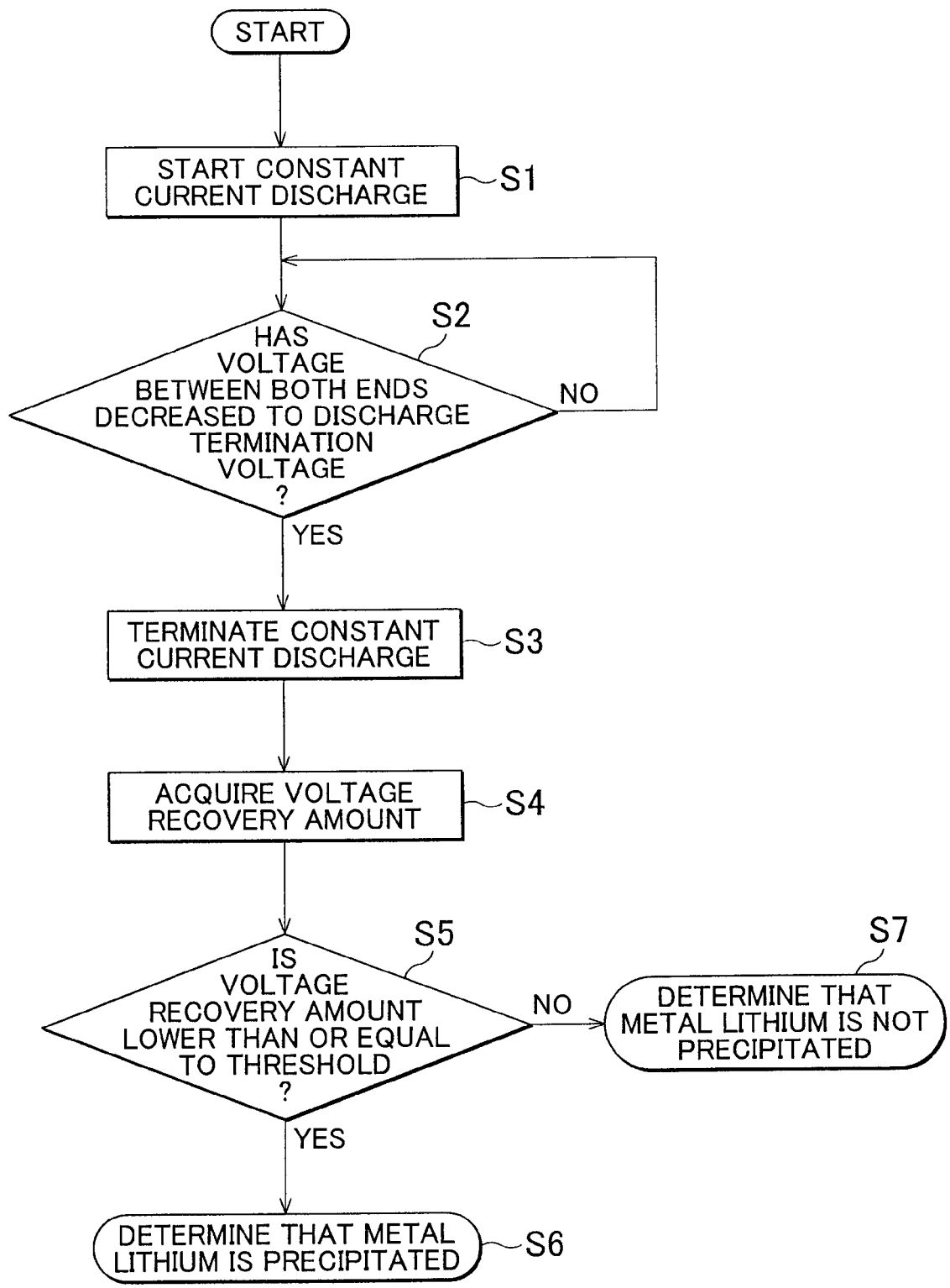
FIG. 2 is a flowchart of a determination procedure executed by the lithium precipitation determination system according to the embodiment of the invention.

Determination is made by the lithium precipitation determination system 1 shown in FIG. 1 in accordance with the procedure shown in the flowchart of FIG. 2. First, constant current discharge is started (S1). That is, the relay 6 is connected, and the discharging unit 9 is operated by discharging current from the battery group 5. At this time, the status of operation of the discharging unit 9 is controlled while monitoring the ammeter 2 so that the discharging current is constant.

The current value of the constant current discharge is set to fall within the range that does not degrade the batteries of the battery group 5. In order not to degrade the batteries of the battery group 5 in constant current discharge, the current value should be set to a value in ampere that is lower than or equal to three times of the value that indicates the battery capacity of the battery group 5 in Ah (ampere hour). For example, when the battery capacity of the battery group 5 is 5 Ah, the current value of constant current discharge should be lower than or equal to 15 A. The current having the above current value almost does not adversely influence the service life of the batteries. In addition, the current value should be set to a value that is higher than or equal to one-tenth of the value that indicates the battery capacity of the battery group 5 in Ah (ampere hour). This is because an extremely low current causes an increased period of time for determination.

Note that, when the voltage between both ends of the battery group 5 before constant current discharge is started in step S1 is too low, the battery group 5 may be preliminary charged to some degree ahead of constant current discharge. In this case, a threshold for determining whether to perform preliminary charge (preliminary charge determination threshold) is set for the preliminary voltage of both ends of the battery group. For the threshold, for example, it is conceivable that a voltage corresponding to the 60 to 70 percent SOC (state of charge) is used as a determination start allowable voltage. Then, when the preliminary voltage of both ends of the battery group 5 is higher than or equal to the determination start allowable voltage, the constant current discharge is immediately started; whereas, when the preliminary voltage of both ends of the battery group 5 is lower than the determination start allowable voltage, charging is performed. When the preliminary charge determination threshold is too low, constant current discharge cannot be sufficiently performed, and there is a possibility that the determination accuracy for the lithium precipitation determination system 1 cannot be sufficiently obtained. On the other hand, when the preliminary charge determination threshold is too high, an unnecessary process is performed, and it takes an extra period of time for determination.

In addition, a target charge voltage for preliminary charge is desirably set to a voltage that ranges from a value that is equal to the preliminary charge determination threshold (a voltage corresponding to the 60 to 70 percent SOC (state of charge)) to a value that is higher by the 10 percent SOC than the preliminary charge determination threshold. This is because, as the target charge voltage is too low, the voltage of the batteries at the time of start of constant current discharge is insufficient and, as a result, measurement accuracy deteriorates. In addition, this is also because, as the target charge voltage is too high, it takes time for charging and constant current discharge thereafter. Charging is, of course, performed using the charging unit 8 of the load 7.

While the constant current discharge started in step S1 is being performed, the voltage between both ends of the battery group 5 is constantly monitored. This monitors whether the voltage between both ends has decreased to a predetermined discharge termination voltage VQ (S2). The discharge termination voltage VQ at this time is desirably a voltage corresponding to the 10 to 20 percent low SOC. If the discharge termination voltage VQ is too high, appropriate determination cannot be made as will be described later. On the other hand, if the discharge termination voltage VQ is too low, the battery group 5 is brought into an overdischarge state. That is, the determination process itself degrades the battery group 5.

When the voltage between both ends has decreased to the discharge termination voltage VQ (S2: YES), the constant current discharge is terminated, and the relay 6 is opened (S3). Then, after that, the voltage between both ends of the battery group 5 naturally increases to some extent. Then, the amount of increase in the voltage, that is, the voltage recovery amount VR, is acquired (S4). The details will be described later. Then, the acquired voltage recovery amount VR is compared with a threshold (lithium precipitation determination threshold) predetermined therefor (S5). When the acquired voltage recovery amount VR is lower than or equal to the threshold (S5: YES), it is determined that metal lithium is precipitated in the battery group 5 (S6). When the acquired voltage recovery amount VR is higher than the threshold (S5: NO), it is determined that metal lithium is not precipitated in the battery group 5 (S7). Up to this point, the basic procedure of determination according to the present embodiment is described.

Figure 3:
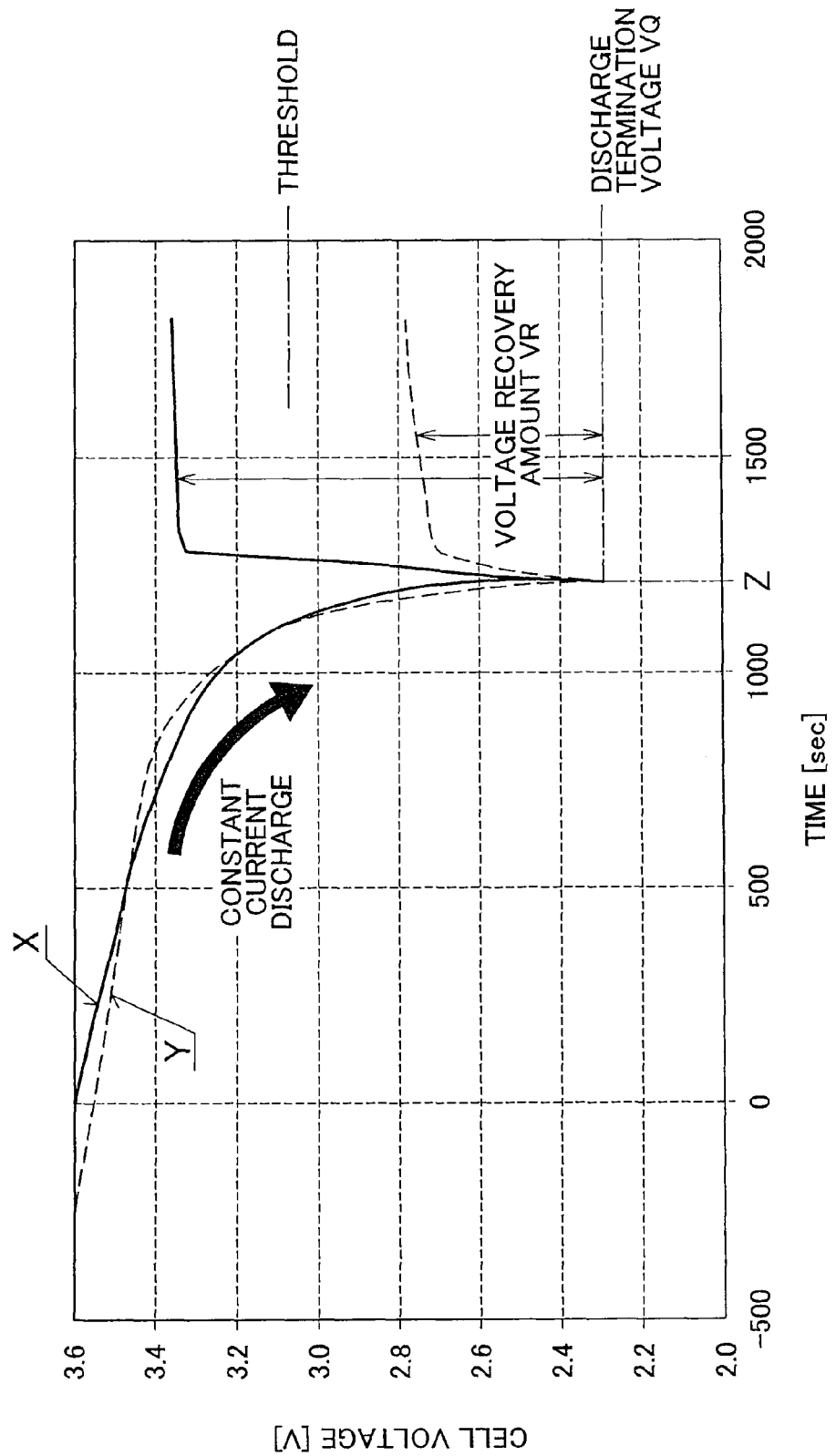
FIG. 3 is a graph that shows changes in voltage of both ends of a battery in the determination procedure according to the embodiment of the invention.

Next, the process shown in the flowchart of FIG. 2 will be described in further details with reference to FIG. 3. FIG. 3 is a graph that shows changes in voltage of the battery group 5 in process of executing the process shown in FIG. 2. The ordinate axis represents a cell voltage (voltage between both ends of each battery) [V], and the abscissa axis represents time [s]. The graph of FIG. 3 shows a curve X and a curve Y. The curve X is an example of a voltage change obtained when metal lithium is not precipitated in the battery group 5. The curve Y is an example of a voltage change obtained when metal lithium is precipitated in the battery group 5. In FIG. 3, time Z at which the voltage is the lowest corresponds to the time at which the constant current discharge is terminated in step S3 in FIG. 2. In FIG. 3, the curve X and the curve Y are overlappingly shown so that the time at which the constant current discharge is terminated coincides with each other with respect to the abscissa axis. Then, the zero point of the abscissa axis is set at the time at which the constant current discharge is started (corresponding to S1 in FIG. 2) in the curve X for the sake of convenience.

In FIG. 3, a portion before (on the left side of) time Z is a period of time during which the constant current discharge is performed from step S1 to step S3 in FIG. 2. In FIG. 3, the cell voltage at the time when the constant current discharge is started is set at 3.6 V, and the discharge termination voltage VQ is set at 2.3 V in cell voltage. During the constant current discharge, the cell voltage gradually decreases. The curve X and the curve Y slightly differ from each other in the shape of the graph during the constant current discharge; however, this difference falls within the range of individual difference, and is not a significant difference.

When the constant current discharge is terminated at time Z, the cell voltage steeply increases thereafter. However, the cell voltage does not increase without limit, the curve X converges to about 3.3 to 3.4 V, and the curve Y converges to about 2.7 to 2.8 V. A difference between the converged cell voltage and 2.3 V that is the cell voltage VQ at the time of termination of discharge is the voltage recovery amount VR acquired in step S4 in FIG. 2. That is, the voltage recovery amount VR of the curve X is about 1.0 to 1.1 V, and the voltage recovery amount VR of the curve Y is about 0.4 to 0.5 V. A specific manner of determining the voltage recovery amount VR in FIG. 3 will be described later.

The voltage recovery amount VR obtained here is compared with the lithium precipitation determination threshold. In FIG. 3, the threshold is set at 0.8 V (3.1 V in cell voltage); however, this is just an example. In the curve X, the voltage recovery amount VR is higher than the threshold, so it may be determined that metal lithium is not precipitated in the battery group 5. In the curve Y, the voltage recovery amount VR is lower than or equal to the threshold, so it may be determined that metal lithium is precipitated in the battery group 5. Thus, it is possible to determine whether metal lithium is precipitated in the battery group 5.

Note that the determination that metal lithium is precipitated does not mean that metal lithium is precipitated because of the above described constant current discharge; the determination means that metal lithium has already been precipitated before the constant current discharge (or preceding preliminary charge) is started. In addition, as is apparent from FIG. 3, determination as to whether metal lithium is precipitated in the present embodiment may be adequately carried out about 30 minutes later after the constant current discharge is started.

Figure 4:
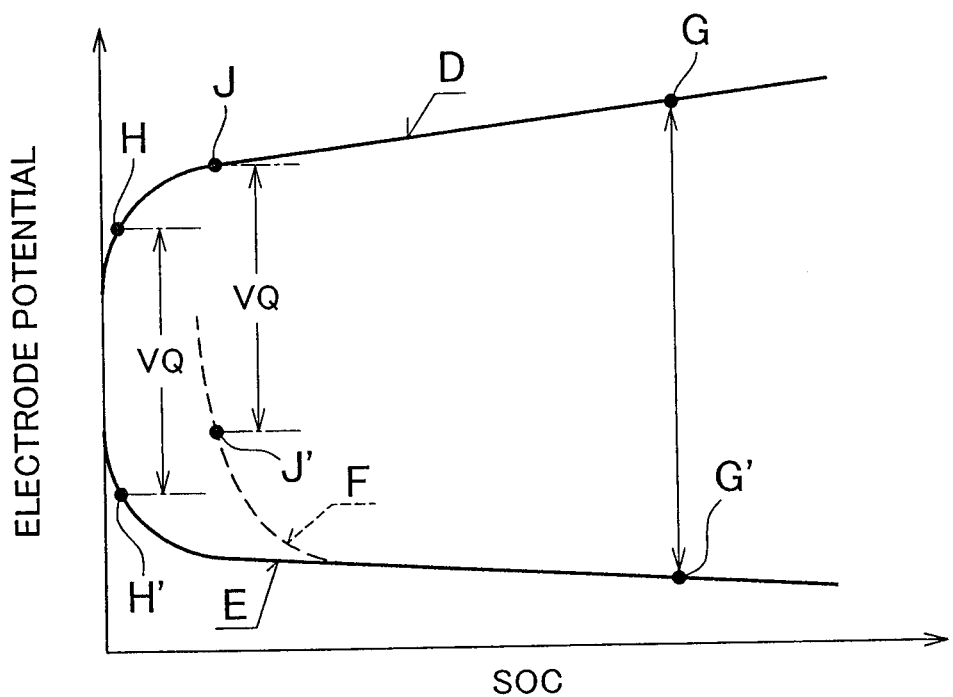
FIG. 4 is a graph that shows the relationship between an SOC (state of charge) and potentials of positive and negative electrodes in a lithium ion secondary battery according to the embodiment of the invention.

Next, the reason why it may be determined whether metal lithium is precipitated through the above described procedure will be described with reference to the graph of FIG. 4. FIG. 4 is a graph that shows the relationship between an SOC (state of charge) and potentials of positive and negative electrodes in the lithium ion secondary battery. In the graph of FIG. 4, the ordinate axis represents the potentials of electrodes, and the abscissa axis represents the SOC of the batteries. The graph of FIG. 4 shows a curve D, a curve E and a curve F. The curve D is a curve for the positive electrode potential. The curve E is a curve for the negative electrode potential in the negative electrode in which metal lithium is not precipitated. The curve F is a curve for the negative electrode potential in the negative electrode in which metal lithium is precipitated. Note that the positive electrode potential is not differentiated depending on whether metal lithium is precipitated. This is because, as described above, metal lithium precipitates in the negative electrode.

The curve D of the positive electrode potential in FIG. 4 slopes upward as a whole. Within the curve D, particularly, a slope in a low SOC range is steep. The slope corresponds to the magnitude of polarization in the positive electrode of the lithium ion secondary battery. That is, polarization in the positive electrode of the lithium ion secondary battery is substantially constant in the range other than the low SOC range, and is higher in the low SOC range than in the other range.

On the other hand, the curve E of the negative electrode potential (no metal lithium precipitation) slopes downward as a whole. Within the curve E as well, particularly, a slope in a low SOC range is steep. The absolute value of the slope corresponds to the magnitude of polarization in the negative electrode of the lithium ion secondary battery. That is, polarization in the negative electrode of the lithium ion secondary battery is substantially constant in the range other than the low SOC range, and is higher in the low SOC range than in the other range. In addition, in the range in which the curve D has large polarization, the curve E also has large polarization. That is, in the lithium ion secondary battery in which metal lithium is not precipitated, as the polarization of the positive electrode increases, the polarization of the negative electrode also increases. Furthermore, the curve E in FIG. 4 is located below the curve D as a whole. That is, the curve E is located below the curve D at the left end in FIG. 4 where the SOC is lowest.

The curve F in the case where metal lithium is precipitated may be presumed as the one that is obtained by substantially shifting the curve E slightly rightward in parallel as a whole. Thus, in the range in which the curve F has large polarization, the curve D has small polarization. In addition, the curve F substantially overlaps with the curve E in FIG. 4 except the range in which the polarization is large.

Voltage measurement described with reference to FIG. 2 and FIG. 3 according to the present embodiment is as follows when applied to FIG. 4. First, the cell voltage of the lithium ion secondary battery corresponds to a difference between the positive electrode potential and the negative electrode potential at the same SOC in FIG. 4. For example, G-G' is an example of that. Here, it is assumed that G-G' is a voltage (3.6 V in FIG. 3) at the time when the constant current discharge is started (S1 in FIG. 2). Then, when metal lithium is not precipitated, H-H' corresponds to the voltage VQ (2.3 V at time Z in FIG. 3) at the time when the constant current discharge is terminated (S3 in FIG. 2); whereas, when metal lithium is precipitated, J-J' corresponds to the voltage VQ. The length of H-H' is equal to the length of J-J', and the length of G-G' is larger than the length of H-H' or the length of J-J'. In addition, three points G, G' and J fall within the small polarization range in the respective curves; however, three points H, H' and J' fall within the large polarization range in the respective curves.

Here, focusing on the time at which the constant current discharge is terminated when metal lithium is not precipitated, the points H and H' both fall within the large polarization range as described above. That is, both the positive electrode and the negative electrode are greatly polarized. Large polarization means that the internal resistance of the lithium ion secondary battery is large. In this way, discharge is terminated in a state where the internal resistance is large, so the voltage recovery amount VR thereafter is large. This is because the voltage recovery amount VR is substantially proportional to the product of the internal resistance [Q] of the lithium ion secondary battery at the time of termination of discharge and the current value [A] immediately before the termination of discharge.

On the other hand, when metal lithium is precipitated, as described above, the point J' falls within the large polarization range; however, the point J falls within the small polarization range. That is, the negative electrode is greatly polarized, but the positive electrode is not polarized so much. Therefore, the internal resistance of the lithium ion secondary battery at the time of termination of discharge is smaller than that when metal lithium is not precipitated. Thus, the voltage recovery amount VR after termination of discharge is small by that much. This is the reason why it may be determined whether metal lithium is precipitated on the basis of the voltage recovery amount VR.

Here, the role of the constant current discharge before the voltage recovery amount VR is acquired is to bring the objective lithium ion secondary battery into a determinable state. That is, when the SOC of the lithium ion secondary battery is high (around the points G and G' in FIG. 4), there is almost no difference of polarized state depending on whether metal lithium is precipitated. This is because the curve E and the curve F in FIG. 4 almost overlap each other in this range. Therefore, it is difficult to make determination in this state.

The SOC of the lithium ion secondary battery is decreased by constant current discharge to around the points H, H', J and J' in FIG. 4. By so doing, there appears a difference of polarized state depending on whether metal lithium is precipitated. This is because the curve E and the curve F in FIG. 4 do not overlap each other in this range. The voltage recovery amount VR is acquired in this state, so it is possible to determine whether metal lithium is precipitated. In other words, the role of the constant current discharge is to bring the lithium ion secondary battery into a low state of charge to an extent such that there appears a difference of polarized state depending on whether metal lithium is precipitated.

Note that the internal resistance of the lithium ion secondary battery has temperature dependency. That is, the internal resistance tends to be larger at low temperatures than at high temperatures. This means that the above described voltage recovery amount VR tends to increase at low temperatures as compared with at high temperatures. Therefore, the lithium precipitation determination threshold to be compared with the voltage recovery amount VR desirably has temperature dependency. That is, a large threshold is used at low temperatures as compared with at high temperatures. Conversely, a small threshold is used at high temperatures as compared with at low temperatures. In order to implement the above configuration, it is only necessary that a map that defines a threshold applied at each temperature of the battery group 5 is stored in the processing unit 4. Of course, in the map, thresholds specified for low temperatures should be larger than thresholds specified for high temperatures. Then, an appropriate threshold is selected from among the thresholds in the map on the basis of the temperature acquired by the thermometer 11.

Alternatively, instead of selecting the threshold to be compared with the voltage recovery amount VR from the map on the basis of the temperature of the batteries, the acquired voltage recovery amount VR itself may be corrected on the basis of the temperature of the battery group 5. That is, the voltage recovery amount VR is corrected to a smaller value as the battery temperature decreases; whereas the voltage recovery amount VR is corrected to a larger value as the battery temperature increases. After that, the corrected voltage recovery amount VR is compared with the threshold. Through the above manner as well, it is possible to handle the temperature dependency of the internal resistance of the lithium ion secondary battery.

Next, a method of determining the voltage recovery amount VR in FIG. 3 will be described. Some of determining methods are conceivable; however, any determining method may be used as long as the same method is used each time. The simplest method is based on a fixed waiting time. That is, a waiting time for sampling the voltage between both ends of the battery group 5 after time Z is determined in advance in order to acquire the voltage recovery amount VR. By subtracting the discharge termination voltage VQ per cell from the cell voltage after a lapse of the waiting time, the voltage recovery amount VR may be determined. In FIG. 3, a period of time during which the voltage steeply increases after time Z is slightly shorter than 100 seconds, so it is only necessary that the waiting time is set to a period of time longer than or equal to 100 seconds.

Another determining method focuses on an increase in cell voltage. That is, after time Z, the voltage between both ends of the battery group 5 is periodically repeatedly sampled. Then, the voltage between both ends of the battery group 5 increases each time it is sampled; however, an increase in the voltage becomes extremely small as the curve after time Z in FIG. 3 becomes closer to a horizontal line. Then, a threshold (voltage recovery amount determination threshold) is set for an increase between adjacent voltage values sampled at a constant time interval. The voltage recovery amount VR may be determined on the basis of the cell voltage at which the increase in voltage is smaller than or equal to the threshold.

Another conceivable method is, for example, a determining method in which the curve of a change in voltage value after time Z is approximated to a function that converges to a limit value and then the voltage recovery amount VR is determined on the basis of the limit value. Any of these generally known methods is applicable.

A lithium ion secondary battery equipped for a vehicle is conceivable as a major application of the method of determining whether metal lithium is precipitated in a lithium ion secondary battery according to the present embodiment. The vehicle may be any vehicle that entirely or partially uses electric energy from a lithium ion secondary battery as the power source. The vehicle may be, for example, an electric automobile, a hybrid automobile, a plug-in hybrid automobile, a hybrid railroad vehicle, a forklift, an electric wheelchair, an electric power-assisted bicycle, an electric scooter, or the like.

That is, determination may be made in such a manner that the lithium precipitation determination system 1 shown in FIG. 1 is externally connected to the in-vehicle lithium ion secondary battery. Alternatively, determination may be made by the vehicle by itself in such a manner that a control unit of the vehicle incorporates the function of the lithium precipitation determination system 1 shown in FIG. 1.

Figure 5:
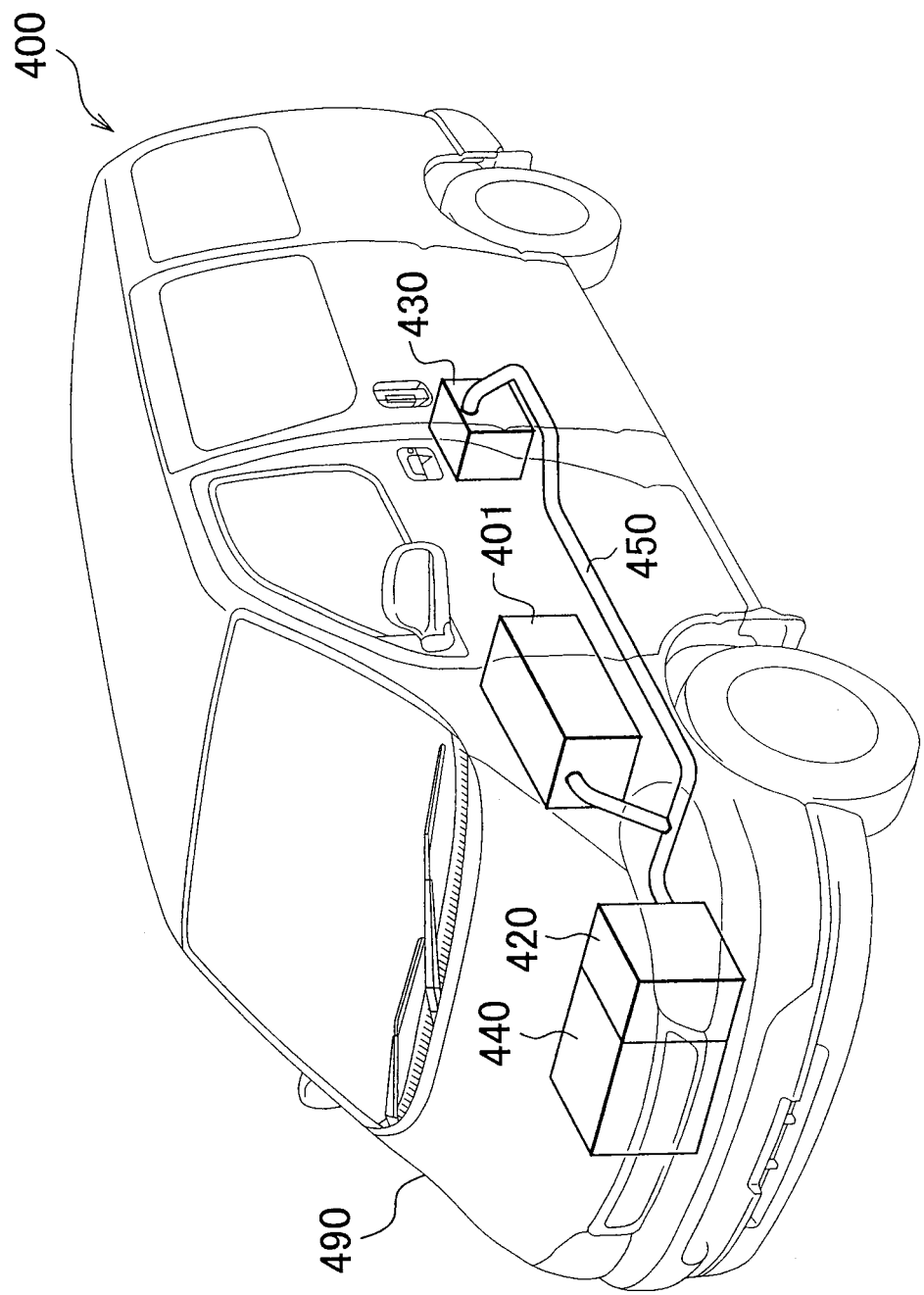
FIG. 5 is a perspective view of a hybrid automobile equipped with the lithium precipitation determination system shown in FIG. 1.

An example of such a vehicle is shown in FIG. 5. The vehicle 400 is a hybrid automobile that is driven by using an engine 440 and a motor 420 in combination. The vehicle 400 includes a vehicle body 490, the engine 440, the motor 420 assembled to the engine 440, a cable 450, a control unit 430 and a battery pack 401 that contains a plurality of batteries inside. The control unit 430 incorporates not only an inverter, or the like, for driving the motor 420 but also the function of the lithium precipitation determination system 1 shown in FIG. 1. However, the motor 420 in the vehicle 400 serves as the charging unit 8 and the discharging unit 9 among the elements of FIG. 1.

In the case of the vehicle 400, the voltage recovery amount VR in FIG. 3 is desirably about 1 [V]. This is to reliably start the engine 440. However, when the battery group 5 degrades because of precipitation of metal lithium, it may result in a situation that the voltage recovery amount VR becomes only about 0.5 [V]. When such a state is detected by the determining method according to the present embodiment, it is possible to prompt a user to take appropriate measures, such as battery replacement.

Here, in the vehicle 400, usually, it is not assumed to drive the motor 420 through constant voltage control. Therefore, the control unit 430 mostly does not have a constant voltage control function. However, it is not inconvenient because of that. This is because, in the method according to the present embodiment, constant current control is used but constant voltage control is not used. Of course, for some other reasons, the control unit 430 may have a constant voltage control function.

In addition, a lithium ion secondary battery equipped for a device, other than a vehicle, that uses a battery as at least one of energy sources may be set as a determination object. Such a device may be, for example, various household electrical appliances, office equipment and industrial equipment, such as a personal computer, a cellular phone, a battery-powered electric tool and an uninterruptible power supply. In addition, an electric cell that is not formed into a battery pack may be set as a determination object.

As described in detail above, according to the present embodiment, the lithium ion secondary battery performs constant current discharge until the battery voltage has decreased to the discharge termination voltage VQ and then acquires the voltage recovery amount VR after termination of the discharge. The voltage recovery amount VR depends on the internal resistance of the lithium ion secondary battery at the time of termination of discharge as described above, and the internal resistance varies on the basis of whether metal lithium is precipitated in the lithium ion battery. Therefore, it may be determined whether metal lithium is precipitated in the lithium ion battery on the basis of the voltage recovery amount VR. Thus, the system and method that are able to determine whether metal lithium is precipitated in the lithium ion secondary battery and the vehicle equipped with the system are implemented. Here, determination according to the temperature of the battery is possible.

The invention has been described with reference to example embodiments for illustrative purposes only. It should be understood that the description is not intended to be exhaustive or to limit form of the invention and that the invention may be adapted for use in other systems and applications. The scope of the invention embraces various modifications and equivalent arrangements that may be conceived by one skilled in the art.

What is claimed is:

1. A determination system for determining whether metal lithium is precipitated in a lithium ion secondary battery, comprising:
a discharging unit that causes the lithium ion secondary battery to perform constant current discharge until a voltage of the lithium ion secondary battery becomes a voltage corresponding to a predetermined low state of charge;
a natural increase acquisition unit that acquires a natural increase in voltage of the lithium ion secondary battery after the constant current discharge is terminated; and
a precipitation determining unit that compares the acquired natural increase with a predetermined threshold, that determines that the metal lithium is not precipitated when the natural increase is larger than or equal to the threshold, and that determines that the metal lithium is precipitated when the natural increase is smaller than the threshold.

2. The determination system according to claim 1, further comprising a threshold determining unit that increases the threshold used in the precipitation determining unit as a temperature of the lithium ion secondary battery decreases, and that decreases the threshold used in the precipitation determining unit as the temperature of the lithium ion secondary battery increases.

3. The determination system according to claim 1, further comprising a temperature correction unit that corrects the acquired natural increase to a smaller value as a temperature of the lithium ion secondary battery decreases, and that corrects the acquired natural increase to a larger value as the temperature of the lithium ion secondary battery increases, wherein
the precipitation determining unit compares the natural increase corrected by the temperature correction unit with the threshold.

4. The determination system according to claim 1, further comprising:
a start allowability determining unit that, ahead of the constant current discharge, determines whether a voltage of the lithium ion secondary battery is higher than or equal to a predetermined determination start allowable voltage; and
a preliminary charging unit that charges the lithium ion secondary battery to a predetermined target charge voltage, wherein
when the start allowability determining unit determines that the voltage of the lithium ion secondary battery is higher than or equal to the determination start allowable voltage, the constant current discharge is immediately started; whereas, when the start allowability determining unit determines that the voltage of the lithium ion secondary battery is lower than the determination start allowable voltage, the lithium ion secondary battery is charged by the preliminary charging unit and then the constant current discharge is started.

5. The determination system according to claim 4, wherein the determination start allowable voltage corresponds to a 60 to 70 percent state of charge of the lithium ion secondary battery.

6. The determination system according to claim 1, wherein the voltage that corresponds to the predetermined low state of charge corresponds to a 10 to 20 percent state of charge of the lithium ion secondary battery.

7. A vehicle comprising:
   a lithium ion secondary battery; and
   the determination system according to claim 1.

8. A determination method for determining whether metal lithium is precipitated in a lithium ion secondary battery, comprising:
   causing the lithium ion secondary battery to perform constant current discharge;
   terminating the constant current discharge when the lithium ion secondary battery has a predetermined low state of charge through the constant current discharge;
   acquiring a natural increase in voltage of the lithium ion secondary battery after the constant current discharge is terminated;
   comparing the acquired natural increase with a predetermined threshold; and
   determining that the metal lithium is not precipitated when the natural increase is larger than or equal to the threshold, and determining that the metal lithium is precipitated when the natural increase is smaller than the threshold.

9. The determination method according to claim 8, further comprising increasing the threshold for comparison with the natural increase as a temperature of the lithium ion secondary battery decreases, and decreasing the threshold for comparison with the natural increase as the temperature of the lithium ion secondary battery increases.

10. The determination method according to claim 8, further comprising:
    correcting the acquired natural increase to a smaller value as a temperature of the lithium ion secondary battery decreases, and correcting the acquired natural increase to a larger value as the temperature of the lithium ion secondary battery increases; and
    comparing the corrected natural increase with the threshold.

11. The determination method according to claim 8, further comprising:
    ahead of the constant current discharge, determining whether a voltage of the lithium ion secondary battery is higher than or equal to a predetermined determination start allowable voltage; and
    when it is determined that the voltage of the lithium ion secondary battery is higher than or equal to the determination start allowable voltage, the constant current discharge is immediately started; whereas, when it is determined that the voltage of the lithium ion secondary battery is lower than the determination start allowable voltage, the lithium ion secondary battery is charged to a predetermined target charge voltage and then the constant current discharge is started.

12. The determination method according to claim 11, wherein the determination start allowable voltage corresponds to a 60 to 70 percent state of charge of the lithium ion secondary battery.

13. The determination method according to claim 8, wherein the predetermined low state of charge is a 10 to 20 percent state of charge of the lithium ion secondary battery.

* * * * *